US012597909B2

(12) United States Patent
Esquius Morote

(10) Patent No.: US 12,597,909 B2
(45) Date of Patent: Apr. 7, 2026

(54) BULK ACOUSTIC WAVE DEVICE INCLUDING PATTERNED ACOUSTIC MIRROR LAYERS TO REDUCE EFFECTIVE THICKNESS AND RELATED METHODS

(71) Applicant: RF360 Singapore Pte. Ltd, Singapore (SG)

(72) Inventor: Marc Esquius Morote, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 77 days.

(21) Appl. No.: 18/396,856

(22) Filed: Dec. 27, 2023

(65) Prior Publication Data

US 2025/0219614 A1    Jul. 3, 2025

(51) Int. Cl.
H03H 9/17          (2006.01)
H03H 3/02          (2006.01)
H03H 9/54          (2006.01)

(52) U.S. Cl.
CPC .............. *H03H 9/175* (2013.01); *H03H 3/02* (2013.01); *H03H 9/54* (2013.01); *H03H 2003/025* (2013.01)

(58) Field of Classification Search
CPC .... H03H 9/171; H03H 9/02118; H03H 9/175; H03H 9/0533; H03H 9/177
See application file for complete search history.

(56) References Cited

U.S. PATENT DOCUMENTS 10,622,966 B2      4/2020  Yen et al.
2019/0036512 A1*   1/2019  Yen .................... H03H 9/02118

2021/0367577 A1*  11/2021  Aigner .................. H03H 9/172
2022/0131523 A1    4/2022  Klett et al.

FOREIGN PATENT DOCUMENTS

CN        113411065 A  *  9/2021  ............. H03H 9/175
CN        110417371 B  *  6/2022  ......... H03H 9/02015
WO        2018111532 A1    6/2018
WO     WO-2022053161 A1  *  3/2022  ............. H03H 9/175

OTHER PUBLICATIONS

International Search Report and Written Opinion for International Patent Application No. PCT/SG2024/050758 , mailed Apr. 2, 2025, 15 pages.

* cited by examiner

*Primary Examiner* — Quan Tra
(74) *Attorney, Agent, or Firm* — W&T

(57)          ABSTRACT

In an acoustic mirror of a bulk-acoustic wave (BAW) device, acoustic energy is reflected at interfaces of layers having different acoustic impedances, and the wavelengths of the acoustic energy reflected at each layer depends on the layer thickness. The acoustic mirror comprises a patterned layer including a first region of a first material and a second region of the first material separated by a second material to reduce an effective thickness of the layer for acoustic reflection. As operating frequencies in wireless devices increase, current manufacturing practices may be unable to produce the correspondingly thinner layers of the acoustic mirror. Thus, the BAW device described herein can be employed to provide a reduced effective thickness for acoustic reflection with layers having an actual thickness that can be formed by existing manufacturing practices. In some examples, the first material and the second material have different acoustic impedances.

15 Claims, 7 Drawing Sheets

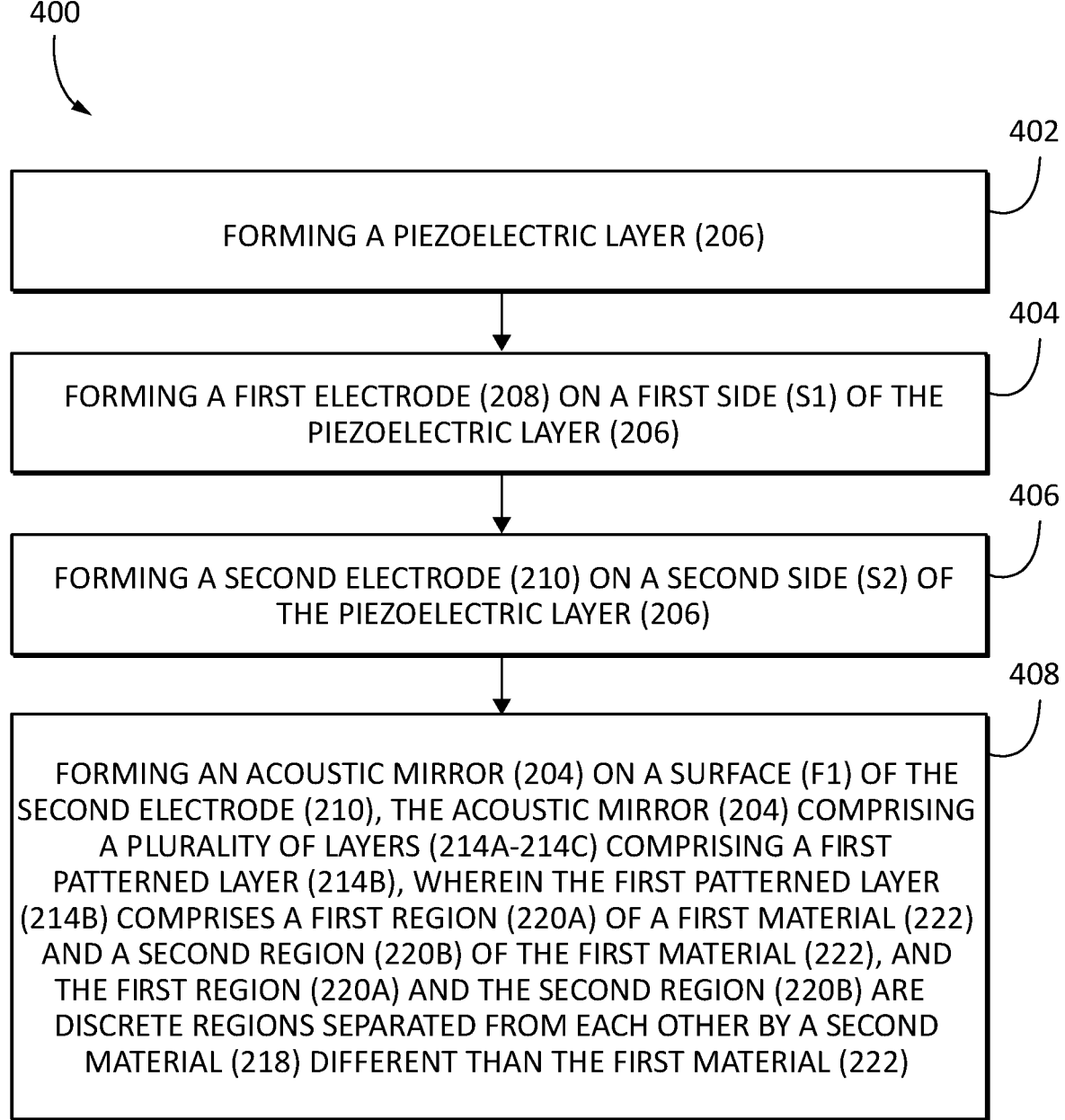

400

402

FORMING A PIEZOELECTRIC LAYER (206)

404

FORMING A FIRST ELECTRODE (208) ON A FIRST SIDE (S1) OF THE PIEZOELECTRIC LAYER (206)

406

FORMING A SECOND ELECTRODE (210) ON A SECOND SIDE (S2) OF THE PIEZOELECTRIC LAYER (206)

408

FORMING AN ACOUSTIC MIRROR (204) ON A SURFACE (F1) OF THE SECOND ELECTRODE (210), THE ACOUSTIC MIRROR (204) COMPRISING A PLURALITY OF LAYERS (214A-214C) COMPRISING A FIRST PATTERNED LAYER (214B), WHEREIN THE FIRST PATTERNED LAYER (214B) COMPRISES A FIRST REGION (220A) OF A FIRST MATERIAL (222) AND A SECOND REGION (220B) OF THE FIRST MATERIAL (222), AND THE FIRST REGION (220A) AND THE SECOND REGION (220B) ARE DISCRETE REGIONS SEPARATED FROM EACH OTHER BY A SECOND MATERIAL (218) DIFFERENT THAN THE FIRST MATERIAL (222)

FIG. 4

BULK ACOUSTIC WAVE DEVICE INCLUDING PATTERNED ACOUSTIC MIRROR LAYERS TO REDUCE EFFECTIVE THICKNESS AND RELATED METHODS

BACKGROUND

I. Field of the Disclosure

The technology of the disclosure relates generally to micro-acoustic devices and, more particularly, to bulk acoustic wave (BAW) devices for solidly mounted resonators (SMR).

II. Background

Wireless devices, such as cellular telephones, communicate by transmitting and receiving electromagnetic waves through the air. Cellular telephones, for example, are wireless devices allowed to operate only in limited ranges of radio frequencies, and those ranges vary depending on the geographical region (e.g., country) of the world. Thus, cellular telephones worldwide need to include filters for blocking certain frequencies while passing others. The frequencies transmitted by a wireless device can be filtered by micro-acoustic devices that are small enough to fit into a handheld device. Examples of micro-acoustic devices include surface acoustic wave (SAW) resonators and bulk acoustic wave (BAW) resonators. SAW and BAW resonators convert electromagnetic waves into acoustic waves and back into electromagnetic waves using inter-digitated electrodes on top of a piezoelectric material or layers of piezoelectric material sandwiched between electrodes, respectively. Battery-powered handheld wireless devices have strict energy efficiency requirements, causing manufacturers of micro-acoustic devices to strive for highly efficient operation. In this regard, the quality of the piezoelectric material and the containment of the acoustic energy created in the piezoelectric material, as well as mode suppression in the BAW resonator, are of significant concern. Improvements are sought in these aspects of micro-acoustic device manufacturing.

SUMMARY

Aspects disclosed in the detailed description include bulk acoustic wave (BAW) devices, including acoustic mirror layers patterned to reduce effective thickness. A method of manufacturing BAW devices, including patterned acoustic mirror layers, is also disclosed. A BAW device includes a piezoelectric layer disposed between electrodes, with one of the electrodes disposed on an acoustic mirror to reflect acoustic energy produced in the piezoelectric layer. An acoustic mirror reflects acoustic energy at interfaces of layers having different acoustic impedances, and the wavelengths of the acoustic energy reflected by an acoustic mirror depends on the thicknesses of those layers. In an exemplary BAW device, the acoustic mirror comprises a patterned layer including a first region of a first material and a second region of the first material separated by a second material to reduce an effective thickness of the layer for acoustic reflection. As operating frequencies in wireless devices increase, current manufacturing practices may be unable to produce the correspondingly thinner layers of the acoustic mirror. Thus, the BAW device described herein can be employed to provide a reduced effective thickness for acoustic reflection with layers having an actual thickness that can be formed by existing manufacturing practices. In some examples, the first material and the second material have different acoustic impedances.

In this regard, in one exemplary aspect, a BAW device is disclosed. The BAW device includes a piezoelectric layer, a first electrode disposed on a first side of the piezoelectric layer, a second electrode disposed on a second side of the piezoelectric layer, and an acoustic mirror disposed between the second electrode and a substrate. The acoustic mirror includes a plurality of layers, including a first patterned layer, wherein the first patterned layer includes a first region of a first material and a second region of the first material, and the first region and the second region are discrete regions separated from each other by a second material different from the first material.

In another exemplary aspect, a method of manufacturing a BAW device is disclosed. The method includes forming a piezoelectric layer, forming a first electrode on a first side of the piezoelectric layer, forming a second electrode on a second side of the piezoelectric layer, and forming an acoustic mirror on a surface of the second electrode. The acoustic mirror includes a plurality of layers including a first patterned layer, wherein the first patterned layer includes a first region of a first material and a second region of the first material, and the first region and the second region are discrete regions separated from each other by a second material different from the first material.

In another exemplary aspect, an acoustic filter package is disclosed. The acoustic filter package includes a substrate and at least one BAW device disposed on the substrate. The BAW device includes a piezoelectric layer, a first electrode on a first side of the piezoelectric layer, a second electrode on a second side of the piezoelectric layer, and an acoustic mirror on a surface of the second electrode. The acoustic mirror includes a plurality of layers including a first patterned layer, wherein the first patterned layer includes a first region of a first material and a second region of the first material, and the first region and the second region are discrete regions separated from each other by a second material different from the first material.

BRIEF DESCRIPTION OF THE DRAWINGS

FIG. 4 is a flowchart illustrating a method of manufacturing a BAW device, which may be the BAW device in FIG. 2 or the BAW device in FIG. 3, including a patterned reflective layer;

DETAILED DESCRIPTION

Figure 1A:
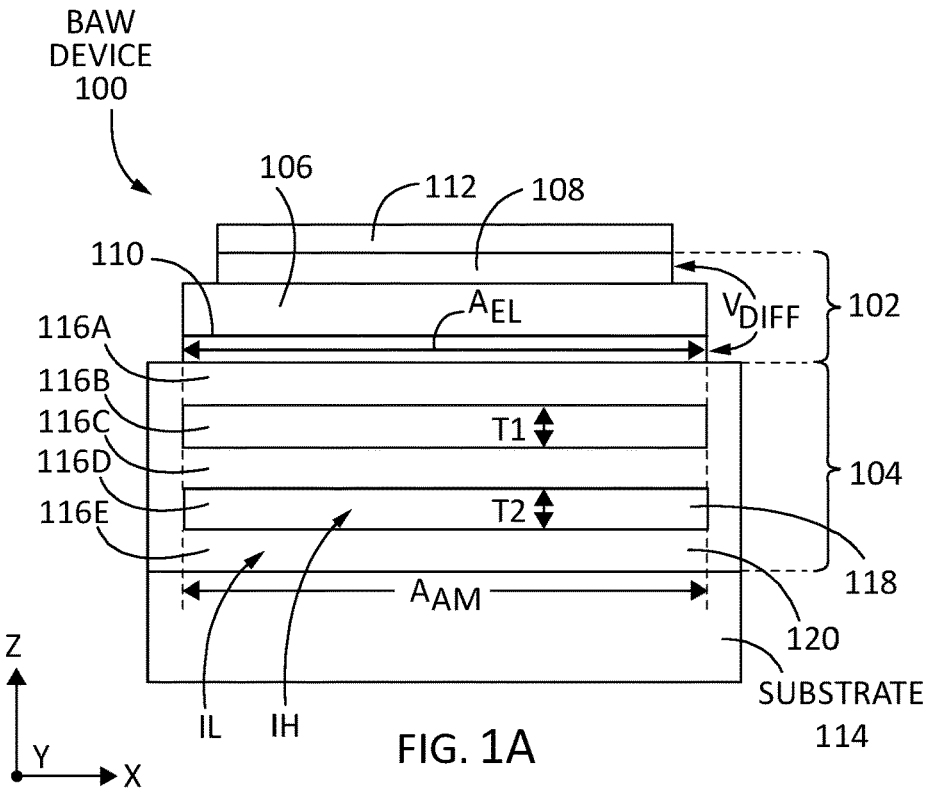
FIG. 1A is a cross-sectional side view of a conventional bulk acoustic wave (BAW) solidly mounted resonator (SMR) stack, which includes a piezoelectric device disposed on an acoustic mirror.

Several exemplary aspects of the present disclosure are described in reference to the drawing figures. The word "exemplary" is used herein to mean "serving as an example, instance, or illustration." Any aspect described herein as "exemplary" is not necessarily to be construed as preferred or advantageous over other aspects.

Aspects disclosed in the detailed description include bulk acoustic wave (BAW) devices including acoustic mirror layers patterned to reduce effective thickness. A method of manufacturing BAW devices including patterned acoustic mirror layers is also disclosed. A BAW device includes a piezoelectric layer disposed between electrodes with one of the electrodes disposed on an acoustic mirror to reflect acoustic energy produced in the piezoelectric layer. An acoustic mirror reflects acoustic energy at interfaces of layers having different acoustic impedances and the wavelengths of the acoustic energy reflected by an acoustic mirror depends on the thicknesses of those layers. In an exemplary BAW device, the acoustic mirror comprises a patterned layer including a first region of a first material and a second region of the first material separated by a second material to reduce an effective thickness of the layer for acoustic reflection. As operating frequencies in wireless devices increase, current manufacturing practices may be unable to produce the correspondingly thinner layers of the acoustic mirror. Thus, the BAW device described herein can be employed to provide a reduced effective thickness for acoustic reflection with layers having an actual thickness that can be formed by existing manufacturing practices. In some examples, the first material and the second material have different acoustic impedances.

FIG. 1A is a cross-sectional side view (in the X-axis and Z-axis directions) of a conventional BAW solidly mounted resonator (SMR) stack 100, which includes a piezoelectric device 102 disposed on an acoustic mirror 104, which may be known as a Bragg mirror. The BAW SMR stack 100 is also referred to herein as a BAW device 100. The piezoelectric device 102 includes a piezoelectric layer 106 sandwiched between a first, top electrode 108 and a second, bottom electrode 110. A passivation layer 112 on the top electrode 108 may be provided for electrical isolation and/or protection from corrosion, for example.

The piezoelectric layer 106 is activated by an electric field generated by a voltage difference $V_{DIFF}$ between the first electrode 108 and the second electrode 110. The voltage difference $V_{DIFF}$ is provided by an input signal (not shown), which fluctuates over time, causing a thickness of the piezoelectric layer 106 to also fluctuate, creating acoustic waves that propagate vertically (and horizontally) into the acoustic mirror 104.

The acoustic mirror 104 is formed on a substrate 114, such as a silicon substrate, and comprises reflective layers 116A-116E that alternate between a first material 118 having a higher acoustic impedance IH and a second material 120 having a lower acoustic impedance IL. The higher acoustic impedance IH of the first material 118 is higher than the lower acoustic impedance IL of the second material 120. As known in the art, acoustic impedance is a measure of the opposition to acoustic flow resulting from an acoustic pressure and is, in part, dependent on the material to which the acoustic pressure is applied. The first material 118 may be a metal, such as tungsten (W) or molybdenum (Mo), and the second material 120 may be a dielectric material (e.g., amorphous silicon dioxide, $SiO_2$) or other non-metal. In some examples, the first material 118 may be a dielectric material or other non-metal and the second material 120 may be a metal. In some examples, both of the first material 118 and the second material 120 may be dielectrics or other non-metals having different acoustic impedances. In some examples, both of the first material 118 and the second material 120 may be metals having different acoustic impedances.

In each of the reflective layers 116A-116E, there is an area $A_{AM}$ corresponding to or directly opposite to an area $A_{EL}$ of the bottom electrode 110. The area $A_{AM}$ extends in a first direction (e.g., X-axis direction) and a second direction (e.g., Y-axis direction) orthogonal to the first direction. In the area $A_{AM}$, the reflective layer 116A is formed of the second material 120 having the lower acoustic impedance IL, and the reflective layer 116B is formed of the first material 118 having the higher acoustic impedance IH. Together, the reflective layers 116A, 116B may be referred to as a mirror pair. Similarly, reflective layers 116C and 116D form another mirror pair, where reflective layer 116C is formed of the second material 120 in the area $A_{AM}$ and the reflective layer 116D is formed of the first material 118 in the area $A_{AM}$. The reflective layer 116E is also a layer of the second material 120 having the lower acoustic impedance. The reflective layers 116A and 116E may also be referred to as isolation layers because they may provide electrical isolation from the bottom electrode 110 and the substrate 114.

Figure 1B:
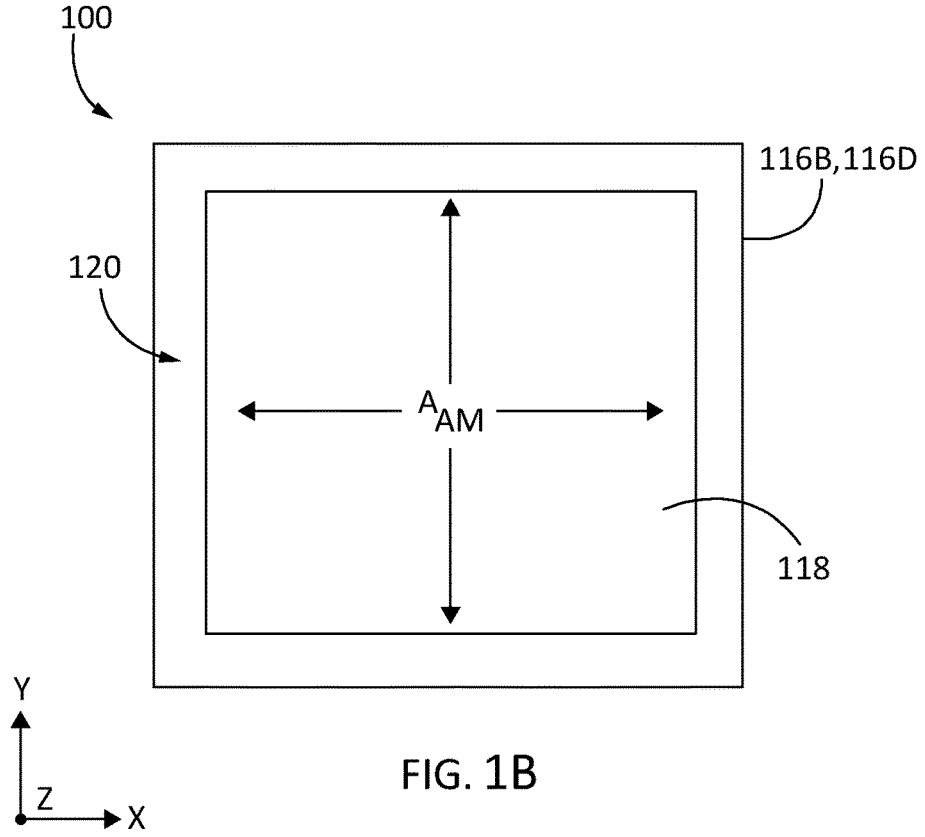
FIG. 1B is a cross-sectional top-down view of a reflective layer of an acoustic mirror in the BAW SMR stack in FIG. 1A.

FIG. 1B is a top-down view of a cross-section (in the X-axis and Y-axis directions) of the BAW SMR stack 100 in FIG. 1A. The view in FIG. 1B represents a cross-section through either of the reflective layers 116B or 116D that are formed of the first material 118 in the area $A_{AM}$. As shown, in these layers, the entire area $A_{AM}$ is a single continuous region of the first material 118. Outside of the area $A_{AM}$ in the reflective layers 116B, 116D, the first material 118 may terminate at a lateral edge at an interface to the second material 120 or another material, as the area outside the area $A_{AM}$ is less significant to the acoustic reflection provided by the reflective layer. Thus, the frequency of acoustic waves reflected at surfaces of the reflective layers 116B and 116D is dependent on the thicknesses (T1, T2) of the first material 118 as shown in FIG. 1A. For example, the thicknesses T1 and T2 of the reflective layers 116B and 116D may correspond to a fraction (e.g., ¼, ½, ¾) of the wavelength (λ) of acoustic waves that are reflected by the reflective layers 116B and 116C. As in any SMR device, the mirror stack is designed to confine the energy of the main mode (e.g., target resonant frequency) within the BAW stack. However, the energy at higher and/or lower frequencies, such as multiples of the main frequency of operation, are also confined. For example, a ¾ lambda size mirror stack would also reflect energy at ¼ lambda, 5/4 lambda, etc. as well as energy at the frequency lambda. This creates additional unwanted resonances often referred to as "spurious" mirror modes.

Figure 2:
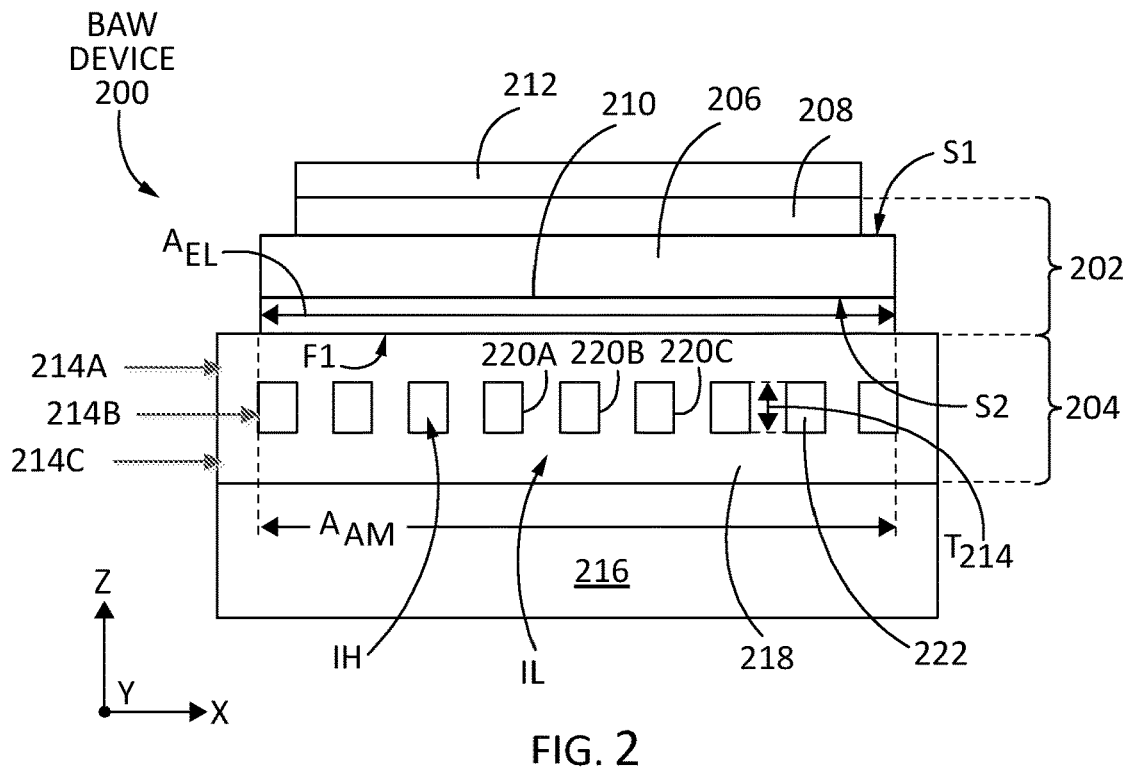
FIG. 2 is a cross-sectional side view of an exemplary BAW device, including a piezoelectric device disposed on an acoustic mirror in which at least one reflective layer is a patterned layer comprising a region of a first material of a higher acoustic impedance and a region of a second material of a lower acoustic impedance opposite to a bottom electrode of the piezoelectric device.

FIG. 2 is a cross-sectional side view of an exemplary BAW device 200 including a piezoelectric device 202 disposed on an acoustic mirror 204. The piezoelectric device 202 may be the piezoelectric device 102 in FIG. 1A, including a piezoelectric layer 206 with a first, top electrode 208 on a first side S1 of the piezoelectric layer 206, and a second, bottom electrode 210 on a second side S2 of the piezoelectric layer 206. A passivation layer 212 is disposed on the first electrode 208. The acoustic mirror 204 is on (e.g., directly on and acoustically coupled to) a surface F1 of the second electrode 210. The acoustic mirror 204 includes a plurality of reflective layers 214A-214C disposed between the second electrode 210 and a substrate 216. The reflective layers 214A and 214C in this example correspond to the reflective layers 116A and 116E in FIG. 1A, being formed entirely of a second material 218, which corresponds to the second material 120 in FIG. 1A. Thus, the reflective layers 214A and 214C may be described as isolation layers.

In contrast to the BAW SMR stack 100 in FIGS. 1A and 1B, the reflective layer 214B in the BAW device 200 is referred to herein as a patterned layer 214B, meaning that the reflective layer 214B includes a first region 220A of a first material 222 and a second region 220B of the first material 222, wherein the first region 220A and the second region 220B are discrete regions separated from each other by the second material 218, which is a different material than the first material 222. In other words, the first region 220A and the second region 220B are not regions of a larger continuous area of the first material 222 but may be considered discrete islands of the first material 222 surrounded by the second material 218, in this example. The first material 222 has a higher acoustic impedance IH and the second material 218 has a lower acoustic impedance IL, lower than the higher acoustic impedance IH. The patterned layer 214B has a thickness $T_{214}$ in the Z-axis direction. More particularly, both the first material 222 and the second material 218 in the patterned layer 214B have the same thickness $T_{214}$. However, it has been found that the patterned layer 214A, including discrete regions 220A and 220B (and others) of the first material 222 separated in the X-axis and Y-axis directions and comprising the second material 218, reflects different acoustic wavelength(s) than those of either a reflective layer comprising only the first material 222 in the area and having the thickness $T_{214}$ or a reflective layer comprising only the second material 218 in the area $A_{AM}$ and having the thickness $T_{214}$.

As noted above, the reflective layer 214A may be referred to as an isolation layer 214A because it is disposed adjacent to the second electrode 210 and electrically isolates the reflective layer 214B from the second electrode 210. The second electrode 210 is on a first side of the reflective layer 214A and the reflective layer 214B is on a second side of the reflective layer 214A. The first and second regions 220A and 220B are in an area $A_{AM}$ that corresponds in size and location to an area $A_{EL}$ of the second electrode 210. The area $A_{AM}$ extends in the X-axis and Y-axis directions, which are orthogonal to each other and parallel to the surface F1 of the second electrode 210. The area $A_{AM}$ of the patterned layer 214B may be the same size as the second electrode 210 in the X and Y directions and is opposite to the second electrode 210 (e.g., on opposite sides of the reflective layer 214A).

The reflective layer 214B may include, as shown in the example in FIG. 2, additional regions, referred to collectively as regions 220C, formed of the first material 222 and separated from each other in the X-axis direction by the second material 218. Thus, the second material 218 is disposed between one of the additional regions 220C and the second region 220B in the X-axis direction.

Having the regions 220A-220C of the first material 222 with the second material 218 between them, the reflective layer 214B does not provide the same acoustic reflection as the solid reflective layers 116B and 116D of the first material 118 in FIG. 1A. Rather, the combination of materials disposed in the area $A_{AM}$ reflects acoustic waves have a smaller wavelength (e.g., higher frequency) than the solid reflective layers 116B and 116D having a same thickness. In this regard, the reflective layer 214B may be considered effectively thinner with respect to acoustic wave reflection than solid reflective layers of the same physical thickness.

Figure 3:
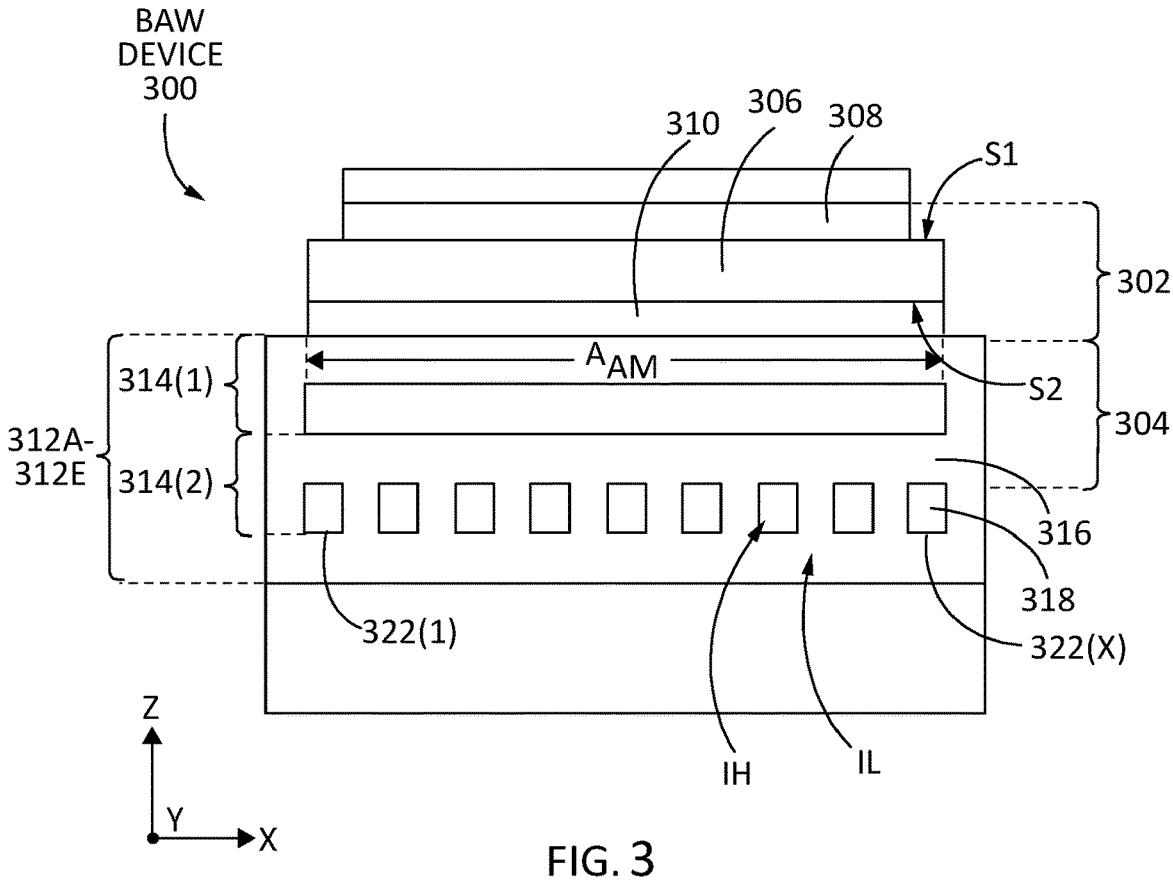
FIG. 3 is a cross-sectional side view of another BAW device, including a piezoelectric device in which the reflective layers of the acoustic mirror include at least one patterned layer of a region of a first material and region of a second material.

FIG. 3 is a cross-sectional side view of an exemplary BAW device 300, including a piezoelectric device 302 disposed on an acoustic mirror 304. The piezoelectric device 302 may be the piezoelectric device 202 in FIG. 2, including a piezoelectric layer 306 with a first, top electrode 308 on a first side S1 of the piezoelectric layer 306, and a second, bottom electrode 310 on a second side S2 of the piezoelectric layer 306.

The BAW device 300 differs from the BAW device 200 with respect to the acoustic mirror 304. Specifically, the acoustic mirror 304 includes five (5) reflective layers 312A-312E as opposed to the acoustic mirror 204 in FIG. 2, including only three (3) reflective layers 214A-214C. The acoustic mirror 304 includes a first mirror pair 314(1) formed by an isolation layer 312A of a second material 316 having a lower acoustic impedance IL, and the reflective layer 312B, formed of a first material 318 having a higher acoustic impedance IH in an area $A_{AM}$ opposite to and corresponding in size to the bottom electrode 310. The acoustic mirror 304 also includes a second mirror pair 314(2) formed by the reflective layers 312C and 312D, where the reflective layer 312D is also referred to as patterned layer 312D. The reflective layer 312C disposed between the patterned layer 312D and a "non-patterned" layer 312B comprises the second material 316. The patterned layer 312D corresponds to the patterned layer 214B in FIG. 2, including discrete regions 322(1)-322(X) of the first material 318 separated in the X-axis direction by the second material 316. The solid reflective layer 312B is also referred to herein as a "non-patterned layer" because, at least in the area $A_{AM}$ corresponding to the bottom electrode 310, the reflective layer 312B comprises a single continuous region of the first material 318, like the reflective layers 116B and 116D in FIG. 1A. That is, the non-patterned layer 312B may be limited to one region of the first material 318 in the area $A_{AM}$ corresponding to the bottom electrode 310. In an alternative example, the reflective layer 312B may be patterned, and the reflective layer 312D may be non-patterned. The combination of the non-patterned layer 312B and the patterned layer 312D provides a different acoustic reflection than the acoustic mirror 104 in FIG. 1A. Here, the patterned layer 312D provides an effectively thinner layer due to the patterning of materials having different acoustic impedance.

FIG. 4 is a flowchart illustrating a method of manufacturing a BAW device 400, which may be the BAW device 200 in FIG. 2 or the BAW device 300 in FIG. 3. The method comprises forming a piezoelectric layer 206 (block 402), forming a first electrode 208 on a first side S1 of the piezoelectric layer 206 (block 404), and forming a second electrode 210 on a second side S2 of the piezoelectric layer 206 (block 406). The method also includes forming an acoustic mirror 204 on a surface F1 of the second electrode 210, the acoustic mirror 204 comprising a plurality of layers 214A-214C comprising a first patterned layer 214B, wherein the first patterned layer 214B comprises a first region 220A of a first material 222 and a second region 220B of the first material 222, and the first region 220A and the second region 220B are discrete regions separated from each other by a second material 218 different than the first material 222 (block 408).

Figure 5:
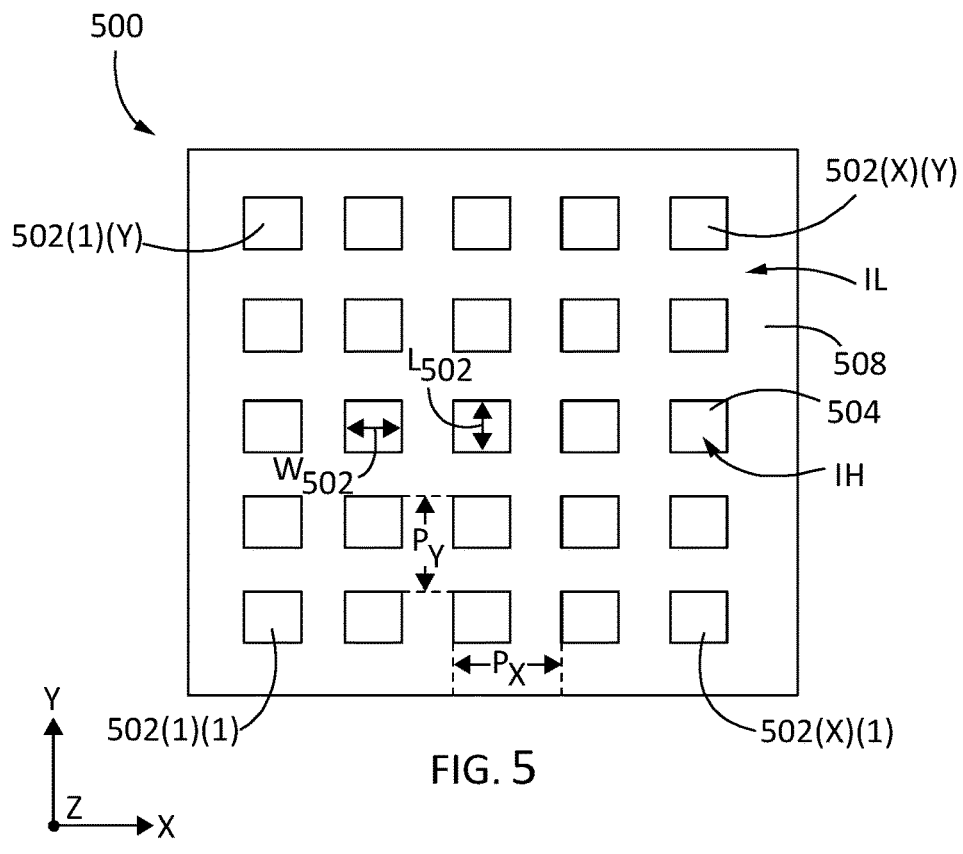
FIG. 5 is a top view in the X-direction and Y-direction corresponding to the patterned layer in FIG. 2 or FIG. 3.

FIG. 5 is a top view of a patterned layer 500 that could be a cross-sectional view in the X-direction and Y-direction of the patterned layer 214B in FIG. 2 or the patterned layer 312D in FIG. 3. The patterned layer 500 includes regions 502(1)(1)-502(X)(Y), where X and Y are both equal to five (5) in this example but could be any appropriate integer number. The regions 502(1)(1)-502(X)(Y) are formed of a first material 504, having a higher acoustic impedance IH, and are discrete regions separated from each other by a second material 508, having a lower acoustic impedance IL that is lower than the higher acoustic impedance IH. FIG. 5 is provided to show that the discrete region 502(2)(2), for example, in addition to being separated from the region 502(2)(1) and region 502(2)(3) in the X-axis direction, is also separated from regions 502(1)(2) and 502(3)(2) in the Y-axis direction. Although the regions 502(1)(1)-502(X)(Y) are shown here as having approximately square shapes, where a width $W_{502}$ in the X-axis and a length $L_{502}$ in the Y-axis direction are the same or approximately the same, they may be of any shape including circular or other polygons. The regions 502(1)(1)-502(X)(Y) may be disposed at a regular pitch $P_X$ in the X-axis direction and a regular pitch $P_Y$ in the Y-axis direction. In some examples, the length $L_{502}$ may be a fraction of the pitch $P_Y$ in a range from one half ($\frac{1}{2}$) to one tenth ($\frac{1}{10}$) and width $W_{502}$ may be a fraction of the pitch $P_X$ in a range from one half ($\frac{1}{2}$) to one tenth ($\frac{1}{10}$). In some examples, two or more of the regions 502(1)(1)-502(X)(Y) may not be completely separate and discrete from each other, having one or more interconnecting segments of the first material 504 extending between them.

Figure 6:
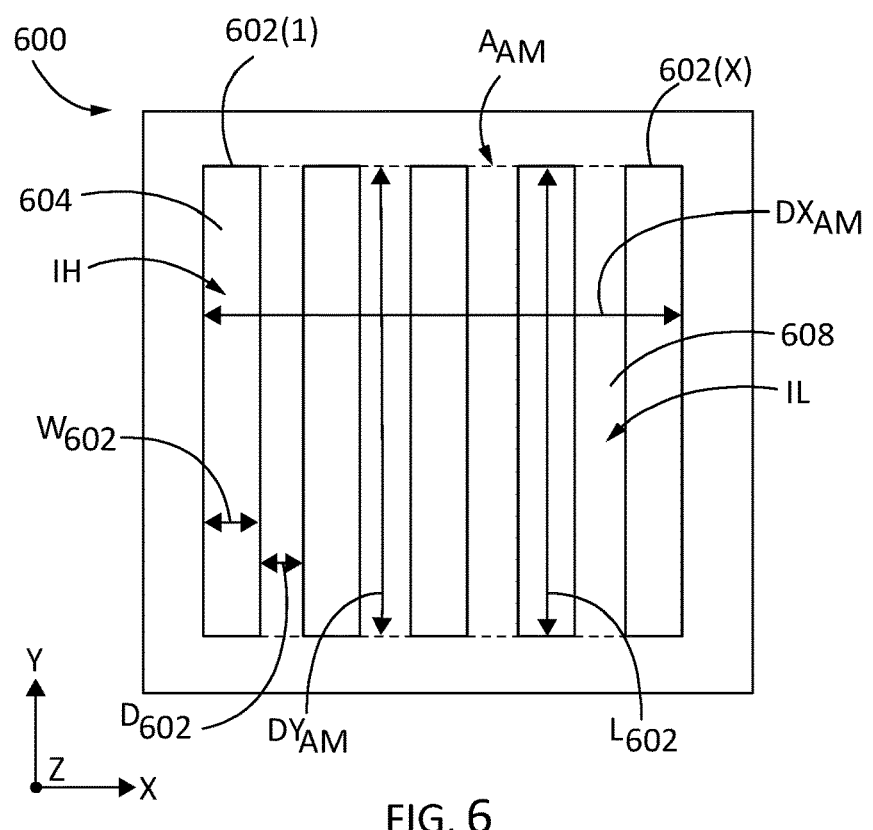
FIG. 6 is a top view of a patterned layer corresponding to the patterned layer in FIG. 2 or FIG. 3.

In this regard, FIG. 6 is a top view of a patterned layer 600 that could be a cross-sectional view in the X-direction and Y-direction of the patterned layer 214B in FIG. 2 or the patterned layer 312D in FIG. 3. The patterned layer 600 includes discrete regions 602(1)-602(X) of a first material 604 having a higher acoustic impedance IH and the discrete regions 602(1)-602(X) are separated from each other in the X-axis direction. The discrete regions 602(1)-602(X), where X=5 in this example but may be any appropriate positive integer, are disposed in an area $A_{AM}$ that corresponds to the area of a bottom electrode in a BAW device, such as the BAW devices 200 and 300 in FIGS. 2 and 3. Between the discrete regions 602(1)-602(X), the patterned layer 600 includes a second material 608 having a lower acoustic impedance IL that is lower than the higher acoustic impedance IH. In contrast to the regions 602(1)(1)-602(X)(Y) in FIG. 6, which include multiple regions in both the X-direction and the Y-direction, each of the regions 602(1)-602(X) has a length $L_{602}$ extending in the Y-axis direction and a width $W_{602}$ extending in the X-axis direction. A distance $D_{602}$ between the regions 602(1)-602(X) is a width of the second material 608, which may be equal to or greater than the width $W_{602}$. Alternatively, the distance $D_{602}$ may be less than the width $W_{602}$. The width $W_{602}$ may be less than one-tenth ($\frac{1}{10}$) of a dimension $DX_{AM}$ of the area $A_{AM}$ in the X-direction, which corresponds to a dimension of the corresponding bottom electrode in the X-direction. The length $L_{602}$ of the regions 602(1)-602(X) may be at least six times the width $W_{602}$. The length $L_{602}$ may be up to 10 (or more) times the width $W_{602}$. The length $L_{602}$ may be equal to a dimension $DY_{AM}$ of the area $A_{AM}$ in the Y-axis direction. Alternatively, the length $L_{602}$ may be in a range of ninety-five percent (95%) to one hundred five percent (105%) of the dimension of the area $A_{AM}$ in the Y-axis direction.

Figure 7:
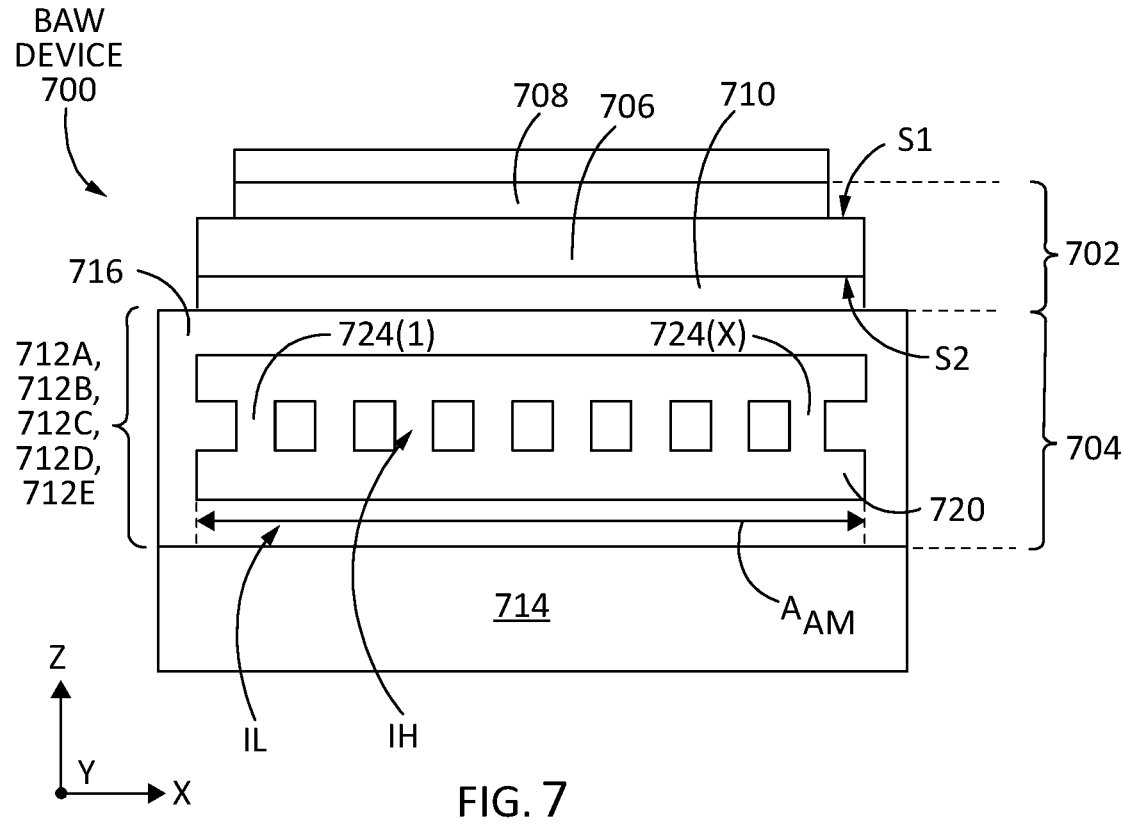
FIG. 7 is a cross-sectional side view of another BAW device, including an acoustic mirror having at least one patterned layer, including a region of a first material and a region of a second material.

FIG. 7 is a cross-sectional side view of an exemplary BAW device 700 including a piezoelectric device 702 disposed on an acoustic mirror 704. The piezoelectric device 702 may be the piezoelectric device 202 in FIG. 2, including a piezoelectric layer 706 with a first, top electrode 708 on a first side S1 of the piezoelectric layer 706, and a second, bottom electrode 710 on a second side S2 of the piezoelectric layer 706. The acoustic mirror 704 includes reflective layers 712A-712E, which include an isolation layer 712A disposed on, directly on, or against the second, bottom electrode 710. The reflective layers 712A-712E also include an isolation layer 712E disposed on, directly on, or against a substrate 714. The reflective layers 712A and 712E may be entirely formed of a second material 716 having a lower acoustic impedance IL. In an area corresponding to the bottom electrode 710, the reflective layers 712B and 712D are formed of first material 720 having a higher acoustic impedance IH, higher than the lower acoustic impedance IL. The reflective layers 712B and 712D may be formed of a single continuous region of the first material 720. The reflective layer 712C in this example may be a patterned layer as shown in FIGS. 5 and 6, including regions 724(1)-724(X) formed of the first material 720 but separated from each other in the X direction by the second material 716. Thus, the non-patterned layer 712B is disposed between the patterned layer 712C and the second electrode 710. The regions 724(1)-724(X) may be coupled (e.g., electrically) to the first material 720 in one or both of the reflective layers 712B and 712D.

Figure 8:
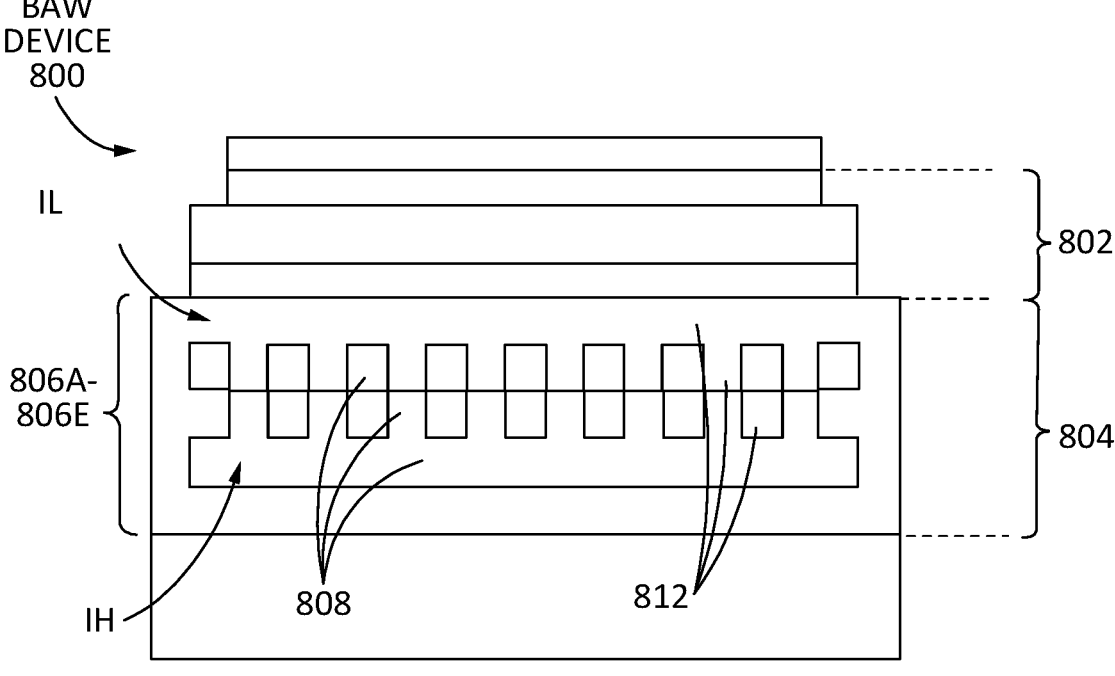
FIG. 8 is a cross-sectional side view of another BAW device including a piezoelectric device disposed on an acoustic mirror in which at least one reflective layer is a patterned layer comprising a region of a first material of a higher acoustic impedance and a region of a second material of a lower acoustic impedance opposite to a bottom electrode of the piezoelectric device.

FIG. 8 is a cross-sectional side view of another exemplary BAW device 800, including a piezoelectric device 802 disposed on an acoustic mirror 804. The acoustic mirror 804 includes reflective layers 806A-806E, which correspond in location to the reflective layers 712A-712E in FIG. 7. The reflective layers 806A and 806C-806E correspond in make-up or form to the reflective layers 712A and 712C-712E. However, the reflective layer 806B is also a patterned layer including discrete regions of a first material 808 having a higher acoustic impedance IH separated in the X-axis direction by a second material 812 having a lower acoustic impedance IL. Thus, the reflective layer 806B is disposed between the patterned layer 806C and the acoustic mirror 804 and both of the patterned layers 806B and 806C are disposed between the non-patterned layer 806D and the acoustic mirror 804, in this example. FIG. 8 is provided to show another example of an arrangement of isolation layers, non-patterned layers, and patterned layers, but it should be understood that the acoustic mirror 804 may include any number of reflective layers in any combination, arrangement, or order of isolation layers non-patterned layers, and/or patterned layers.

Electronic devices, according to any aspects disclosed herein, may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, laptop computer, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 9:
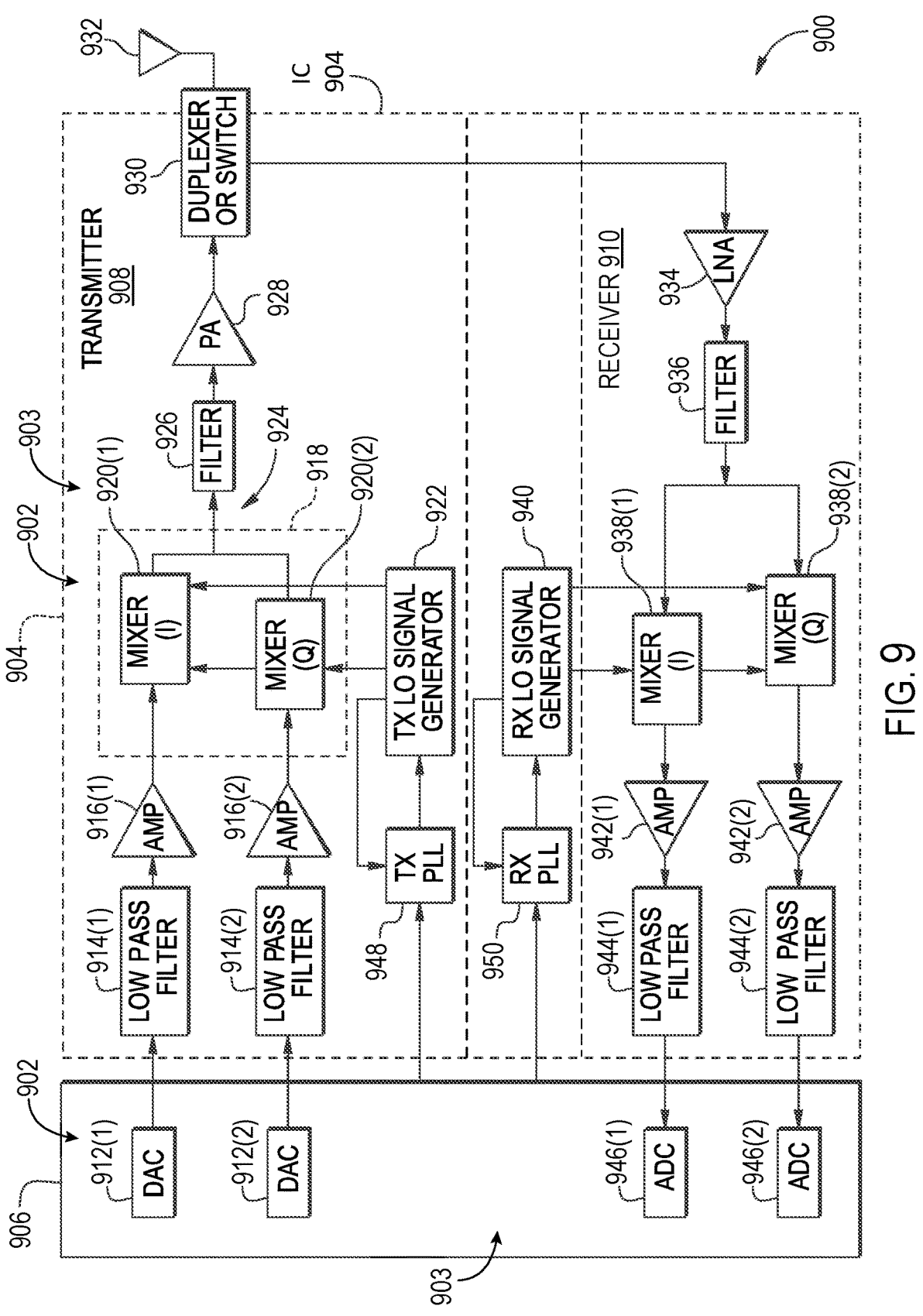
FIG. 9 is a block diagram of an exemplary wireless communication device that includes a BAW device including a piezoelectric device disposed on an acoustic mirror in which at least one reflective layer is a patterned layer comprising a region of a first material of a higher acoustic impedance and a region of a second material of a lower acoustic impedance.

In this regard, FIG. 9 illustrates a block diagram of an exemplary wireless communications device 900 that includes radio frequency (RF) components formed from one or more ICs 902, wherein any of the ICs 902 can include an acoustic filter package including BAW devices in which an acoustic mirror includes at least one patterned layer of a first material and a second material in an area corresponding to a piezoelectric device, as shown in any of FIGS. 2, 3, 7, and 8. The wireless communications device 900 may include or be provided as examples in any of the above-referenced devices. As shown in FIG. 9, the wireless communications device 900 includes a transceiver 904 and a data processor 906. The data processor 906 may include a memory to store data and program codes. The transceiver 904 includes a transmitter 908 and a receiver 910, which support bi-directional communications. In general, the wireless communications device 900 may include any number of transmitters 908 and/or receivers 910 for any number of communication systems and frequency bands. All or a portion of the transceiver 904 may be implemented on one or more analog ICs, RF ICs (RFICs), mixed-signal ICs, etc.

The transmitter 908 or the receiver 910 may be implemented with a super heterodyne or direct-conversion architecture. In the super-heterodyne architecture, a signal is frequency-converted between RF and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 900 in FIG. 9, the transmitter 908 and the receiver 910 are implemented with the direct-conversion architecture.

In the transmit path, the data processor 906 processes data to be transmitted and provides I and Q analog output signals to the transmitter 908. In the exemplary wireless communications device 900, the data processor 906 includes digital-to-analog converters (DACs) 912(1), 912(2) for converting digital signals generated by the data processor 906 into I and Q analog output signals, e.g., I and Q output currents, for further processing.

Within the transmitter 908, lowpass filters 914(1), 914(2) filter the I and Q analog output signals, respectively, to remove undesired signals caused by the prior digital-toanalog conversion. Amplifiers (AMPs) 916(1), 916(2) amplify the signals from the lowpass filters 914(1), 914(2), respectively, and provide I and Q baseband signals. An upconverter 918 upconverts the I and Q baseband signals with I and Q transmit (TX) local oscillator (LO) signals from a TX LO signal generator 922 through mixers 920(1), 920(2) to provide an upconverted signal 924. A filter 926 filters the upconverted signal 924 to remove undesired signals caused by the frequency upconversion and noise in a receive frequency band. A power amplifier (PA) 928 amplifies the upconverted signal 924 from the filter 926 to obtain the desired output power level and provides a transmit RF signal. The transmit RF signal is routed through a duplexer or switch 930 and transmitted via an antenna 932.

In the receive path, the antenna 932 receives signals transmitted by base stations and provides a received RF signal, which is routed through the duplexer or switch 930 and provided to a low noise amplifier (LNA) 934. The duplexer or switch 930 is designed to operate with a specific receive (RX)-to-TX duplexer frequency separation, such that RX signals are isolated from TX signals. The received RF signal is amplified by the LNA 934 and filtered by a filter 936 to obtain a desired RF input signal. Downconversion mixers 938(1), 938(2) mix the output of the filter 936 with I and Q RX LO signals (i.e., LO_I and LO_Q) from an RX LO signal generator 940 to generate I and Q baseband signals. The I and Q baseband signals are amplified by AMPs 942(1), 942(2) and further filtered by lowpass filters 944(1), 944(2) to obtain I and Q analog input signals, which are provided to the data processor 906. In this example, the data processor 906 includes analog-to-digital converters (ADCs) 946(1), 946(2) for converting the analog input signals into digital signals to be further processed by the data processor 906.

In the wireless communications device 900 of FIG. 9, the TX LO signal generator 922 generates the I and Q TX LO signals used for frequency upconversion, while the RX LO signal generator 940 generates the I and Q RX LO signals used for frequency downconversion. Each LO signal is a periodic signal with a particular fundamental frequency. A TX phase-locked loop (PLL) circuit 948 receives timing information from the data processor 906 and generates a control signal used to adjust the frequency and/or phase of the TX LO signals from the TX LO signal generator 922. Similarly, an RX PLL circuit 950 receives timing information from the data processor 906 and generates a control signal used to adjust the frequency and/or phase of the RX LO signals from the RX LO signal generator 940.

Figure 10:
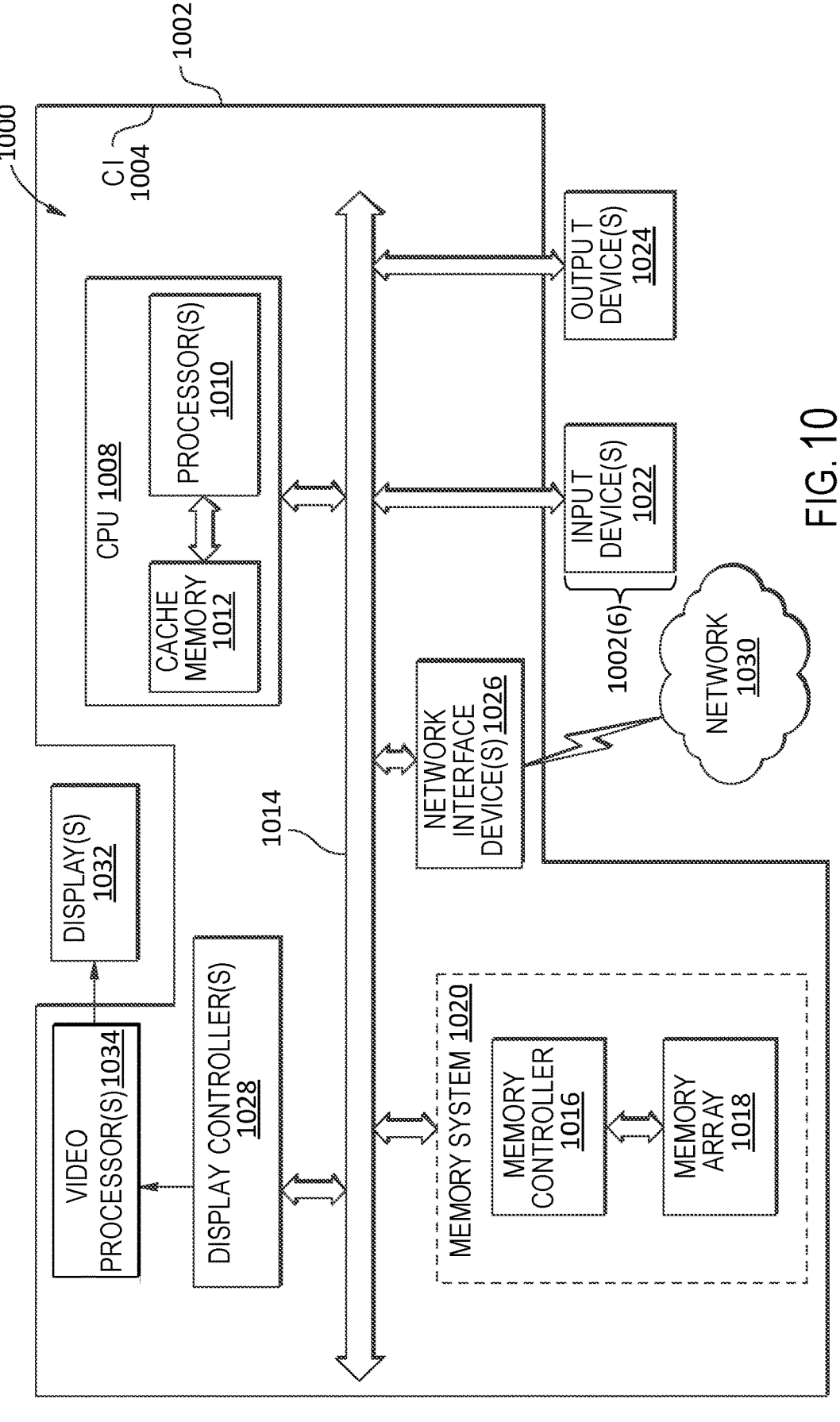
FIG. 10 is a block diagram of an exemplary processor-based system that can include a BAW device including an acoustic mirror in which at least one reflective layer is a patterned layer comprising a region of a first material of a higher acoustic impedance and a region of a second material of a lower acoustic impedance.

FIG. 10 illustrates a block diagram of an example of a processor-based system 1000 that can employ integrated circuits, including an acoustic filter package including BAW devices in which an acoustic mirror includes at least one patterned layer of a first material and a second material in an area corresponding to a piezoelectric device, as shown in any of FIGS. 2, 3, 7, and 8. In this example, the processor-based system 1000 includes a processor 1002 that includes an IC 1004 including one or more central processor units (CPUs) 1008, which may also be referred to as CPU or processor cores, each including one or more processors 1010. The CPU(s) 1008 may have cache memory 1012 coupled to the processor(s) 1002 for rapid access to temporarily stored data. The CPU(s) 1008 is coupled to a system bus 1014 and can intercouple master and slave devices included in the processor-based system 1000. As is well known, the CPU(s) 1008 communicates with these other devices by exchanging address, control, and data information over the system bus 1014. For example, the CPU(s)

1008 can communicate bus transaction requests to a memory controller 1016 as an example of a slave device. Although not illustrated in FIG. 10, multiple system buses 1014 could be provided wherein each system bus 1014 constitutes a different fabric.

Other master and slave devices can be connected to the system bus 1014. As illustrated in FIG. 10, these devices can include a memory system 1020 that includes the memory controller 1016 and one or more memory arrays 1018, one or more input devices 1022, one or more output devices 1024, one or more network interface devices 1026, and one or more display controllers 1028, as examples. The input device(s) 1022 can include any type of input device, including, but not limited to, input keys, switches, voice processors, etc. The output device(s) 1018 can include any type of output device, including, but not limited to, audio, video, other visual indicators, etc. The network interface device(s) 1026 can be any device configured to allow an exchange of data to and from a network 1030. The network 1030 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1026 can be configured to support any type of communications protocol desired.

The CPU(s) 1008 may also be configured to access the display controller(s) 1028 over the system bus 1014 to control information sent to one or more displays 1032. The display controller(s) 1028 sends information to the display(s) 1032 to be displayed via one or more video processors 1034, which process the information to be displayed into a format suitable for the display(s) 1032. The display(s) 1032 can include any type of display, including, but not limited to, a cathode ray tube (CRT), a liquid crystal display (LCD), a plasma display, or a light-emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium wherein any such instructions are executed by a processor or other processing device, or combinations of both. As examples, the devices and components described herein may be employed in any circuit, hardware component, integrated circuit (IC), or IC chip. Memory disclosed herein may be any type and size of memory and may be configured to store any desired information. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. Alternatively, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications, as will be readily apparent to one of skill in the art. Those of skill in the art will also understand that information and signals may be represented using various technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

Implementation examples are described in the following numbered clauses:

1. A bulk acoustic wave (BAW) device comprising:
    a piezoelectric layer;
    a first electrode disposed on a first side of the piezoelectric layer;
    a second electrode disposed on a second side of the piezoelectric layer; and
    an acoustic mirror disposed between the second electrode and a substrate, the acoustic mirror comprising a plurality of layers comprising a first patterned layer;

wherein:

the first patterned layer comprises a first region of a first material and a second region of the first material; and the first region and the second region are discrete regions separated from each other by a second material different from the first material.

2. The BAW device of clause 1, wherein:

the first patterned layer comprises the first material and the second material disposed in a first area of the first patterned layer corresponding to the second electrode; and the first area extends parallel to a surface of the second electrode in a first direction and a second direction orthogonal to the first direction.

3. The BAW device of clause 2, the plurality of layers further comprising a first isolation layer comprising the second material disposed between the second electrode and the first patterned layer.

4. The BAW device of any of clause 1 to clause 3, wherein the first material has a first acoustic impedance and the second material has a second acoustic impedance different from the first acoustic impedance.

5. The BAW device of any of clause 2 to clause 4, wherein:

the first area of the first patterned layer further comprises a third region comprising a discrete region of the first material; and the second material is disposed between the first region and the third region in the second direction.

6. The BAW device of clause 5, wherein:

the first area of the first patterned layer further comprises a fourth region of the first material; and the second material is disposed between the second region and the fourth region in the first direction.

7. The BAW device of clause 5 or clause 6, wherein:

the first area of the first patterned layer further comprises a fifth region of the first material; and the second material is disposed between the third region and the fifth region in the second direction.

8. The BAW device of any of clause 1 to clause 7, wherein each of the first region and the second region comprises:

a distance in the first direction across the second material between the first region and the second region is equal to or greater than a width of the first region in the first direction.

9. The BAW device of clause 8, wherein in each of the first region and the second region, a length of the first region in the second direction is at least five (5) times the width of the first region in the first direction.

10. The BAW device of any of clause 1 to clause 9, wherein:

the first material comprises a metal material; and the second material comprises a dielectric material.

11. The BAW device of any of clause 3 to clause 10, the plurality of layers further comprising:

a substrate; and a second isolation layer comprising the second material disposed between the first patterned layer and the substrate.

12. The BAW device of any of clause 3 to clause 11, wherein the first patterned layer is disposed directly on the first isolation layer, and the second isolation layer is disposed directly on the first patterned layer.

13. The BAW device of any of clause 2 to clause 12, wherein the plurality of layers further comprises:

a non-patterned layer comprising a single region of the first material in the first area corresponding to the second electrode.

14. The BAW device of clause 13, wherein the plurality of layers further comprises a third layer comprising only the second material disposed between the first patterned layer and the non-patterned layer.

15. The BAW device of clause 13, wherein the plurality of layers further comprises a second patterned layer disposed between the first patterned layer and the second electrode.

16. The BAW device of any of clause 13 to clause 15, wherein the first patterned layer and the second patterned layer are disposed between the non-patterned layer and the second electrode.

17. The BAW device of any of clause 13 to clause 15, wherein the non-patterned layer is disposed between the first patterned layer and the second electrode.

18. The BAW device of any of clause 1 to clause 17 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

19. A method of manufacturing a bulk acoustic wave (BAW) device, the method comprising:

forming a piezoelectric layer;

forming a first electrode on a first side of the piezoelectric layer;

forming a second electrode on a second side of the piezoelectric layer; and forming an acoustic mirror on a surface of the second electrode, the acoustic mirror comprising a plurality of layers comprising a first patterned layer;

wherein:

the first patterned layer comprises a first region of a first material and a second region of the first material; and the first region and the second region are discrete regions separated from each other by a second material different than the first material.

20. An acoustic filter package comprising:

a substrate; and at least one bulk acoustic wave (BAW) device disposed on the substrate, the BAW device comprising:

a piezoelectric layer;

a first electrode on a first side of the piezoelectric layer;

a second electrode on a second side of the piezoelectric layer; and an acoustic mirror on a surface of the second electrode, the acoustic mirror comprising a plurality of layers comprising a first patterned layer;

wherein:

the first patterned layer comprises a first region of a first material and a second region of the first material; and the first region and the second region are discrete regions separated from each other by a second material different than the first material.

What is claimed is:

1. A bulk acoustic wave (BAW) device comprising:

a piezoelectric layer;

a first electrode disposed on a first side of the piezoelectric layer;

a second electrode disposed on a second side of the piezoelectric layer; and an acoustic mirror disposed between the second electrode and a substrate, the acoustic mirror comprising a plurality of layers comprising a first patterned layer;

wherein:

the first patterned layer comprises a first region of a first material and a second region of the first material;

the first region and the second region are discrete regions separated from each other by a second material different from the first material;

the first patterned layer comprises the first material and the second material disposed in a first area of the first patterned layer corresponding to the second electrode;

the first area extends parallel to a surface of the second electrode in a first direction and a second direction orthogonal to the first direction; and the plurality of layers further comprising:

a first isolation layer comprising the second material disposed between the second electrode and the first patterned layer;

a substrate;

a second isolation layer comprising the second material disposed between the first patterned layer and the substrate; and a non-patterned layer comprising a single region of the first material in the first area corresponding to the second electrode.

2. The BAW device of claim 1, wherein the plurality of layers further comprises a third layer comprising only the second material disposed between the first patterned layer and the non-patterned layer.

3. The BAW device of claim 1, wherein the plurality of layers further comprises a second patterned layer disposed between the first patterned layer and the second electrode.

4. The BAW device of claim 3, wherein the first patterned layer and the second patterned layer are disposed between the non-patterned layer and the second electrode.

5. The BAW device of claim 3, wherein the non-patterned layer is disposed between the first patterned layer and the second electrode.

6. The BAW device of claim 1 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

7. A method of manufacturing a bulk acoustic wave (BAW) device, the method comprising:

forming a piezoelectric layer;

forming a first electrode on a first side of the piezoelectric layer;

forming a second electrode on a second side of the piezoelectric layer; and forming an acoustic mirror on a surface of the second electrode, the acoustic mirror comprising a plurality of layers comprising a first patterned layer;

wherein:

the first patterned layer comprises a first region of a first material and a second region of the first material;

the first region and the second region are discrete regions separated from each other by a second material different from the first material;

the first patterned layer comprises the first material and the second material disposed in a first area of the first patterned layer corresponding to the second electrode;

the first area extends parallel to a surface of the second electrode in a first direction and a second direction orthogonal to the first direction; and the plurality of layers further comprising:

a first isolation layer comprising the second material disposed between the second electrode and the first patterned layer;

a substrate;

a second isolation layer comprising the second material disposed between the first patterned layer and the substrate; and a non-patterned layer comprising a single region of the first material in the first area corresponding to the second electrode.

8. An acoustic filter package comprising:

a substrate; and at least one bulk acoustic wave (BAW) device disposed on the substrate, the BAW device comprising:

a piezoelectric layer;

a first electrode on a first side of the piezoelectric layer;

a second electrode on a second side of the piezoelectric layer; and an acoustic mirror on a surface of the second electrode, the acoustic mirror comprising a plurality of layers comprising a first patterned layer;

wherein:

the first patterned layer comprises a first region of a first material and a second region of the first material;

the first region and the second region are discrete regions separated from each other by a second material different from the first material;

the first patterned layer comprises the first material and the second material disposed in a first area of the first patterned layer corresponding to the second electrode;

the first area extends parallel to a surface of the second electrode in a first direction and a second direction orthogonal to the first direction; and the plurality of layers further comprising:

a first isolation layer comprising the second material disposed between the second electrode and the first patterned layer;

a substrate;

a second isolation layer comprising the second material disposed between the first patterned layer and the substrate; and a non-patterned layer comprising a single region of the first material in the first area corresponding to the second electrode.

9. A bulk acoustic wave (BAW) device comprising:

a piezoelectric layer;

a first electrode disposed on a first side of the piezoelectric layer;

a second electrode disposed on a second side of the piezoelectric layer; and an acoustic mirror disposed between the second electrode and a substrate, the acoustic mirror comprising a plurality of layers comprising a first patterned layer and a non-patterned layer;

wherein:

the first patterned layer comprises a first region of a first material and a second region of the first material;

the first region and the second region are discrete regions separated from each other by a second material different from the first material;

the first patterned layer comprises the first material and the second material disposed in a first area of the first patterned layer corresponding to the second electrode; and the non-patterned layer comprises a single region of the first material in the first area corresponding to the second electrode.

10. The BAW device of claim 9, wherein the plurality of layers further comprises a first layer comprising only the second material disposed between the first patterned layer and the non-patterned layer.

11. The BAW device of claim 9, wherein the plurality of layers further comprises a second patterned layer disposed between the first patterned layer and the second electrode.

12. The BAW device of claim 11, wherein the first patterned layer and the second patterned layer are disposed between the non-patterned layer and the second electrode.

13. The BAW device of claim 9, wherein the non-patterned layer is disposed between the first patterned layer and the second electrode.

14. The BAW device of claim 9, wherein the plurality of layers further comprises:

a first isolation layer comprising the second material disposed between the second electrode and the first patterned layer; and a substrate.

15. The BAW device of claim 9, wherein the plurality of layers further comprises:

a substrate; and a second isolation layer comprising the second material disposed between the first patterned layer and the substrate.

* * * * *